United States Patent [19]

Aoki et al.

[11] Patent Number: 4,723,838
[45] Date of Patent: Feb. 9, 1988

[54] LIQUID CRYSTAL DISPLAY DEVICE

[75] Inventors: Shigeo Aoki, Habikino; Junichi Tamamura; Yasuhiro Ukai, both of Yao, all of Japan

[73] Assignee: Hosiden Electronics Co., Ltd., Osaka, Japan

[21] Appl. No.: 804,556

[22] Filed: Dec. 4, 1985

[30] Foreign Application Priority Data

Dec. 10, 1984 [JP] Japan .................. 59-260474

[51] Int. Cl.$^4$ .................. G02F 1/13; H01L 29/78; H01L 27/14
[52] U.S. Cl. .................. 350/336; 350/334; 357/23.7; 357/30 K; 357/30 L
[58] Field of Search .............. 350/334, 336; 357/23.7, 357/30 K, 30 L, 32

[56] References Cited

U.S. PATENT DOCUMENTS

| | | | |
|---|---|---|---|
| 3,385,731 | 5/1968 | Weimer | 357/23.7 |
| 3,671,820 | 6/1972 | Haering et al. | 357/23.7 |
| 4,094,582 | 6/1978 | Goodman | 357/23.7 |
| 4,597,001 | 6/1986 | Bortscheller et al. | 357/23.7 |

FOREIGN PATENT DOCUMENTS 0090661 10/1983 European Pat. Off. .......... 350/334

OTHER PUBLICATIONS

Snell et al., "Application of Amorphous Silicon FETs in Addressable Liquid Crystal Display Panels", Applied Physics 1981, pp. 357-362.

Vankateswarlu, "Cds Thin-Film FET", J. Instn. Electronics & Telecom. Engrs., vol. 22, No. 11, 1976, pp. 739-741.

Luo et al., "A low leakage-Current Thin-Film Transistor for Flat-Panel Displays", Biennial Display Research Conference, Oct. 1980, pp. 111-113.

Primary Examiner—Stanley D. Miller
Assistant Examiner—Trong Quang Phan
Attorney, Agent, or Firm—Pollock, Vande Sande and Priddy

[57] ABSTRACT

An active matrix liquid crystal display device has a plurality of display electrodes arranged in a matrix array and selectable through control of thin film transistors for application of voltage between selected display electrodes and a common electrode to obtain image display. Each thin film transistor has a semiconductive layer and a gate insulating film both formed to have the same pattern. Each thin film transistor has a gate electrode formed on the gate insulating film with the edges of the gate electrode inwardly spaced apart from the corresponding edges of the gate insulating film. The semiconductor layer and gate insulating film have extensions extending under a corresponding gate bus.

17 Claims, 27 Drawing Figures

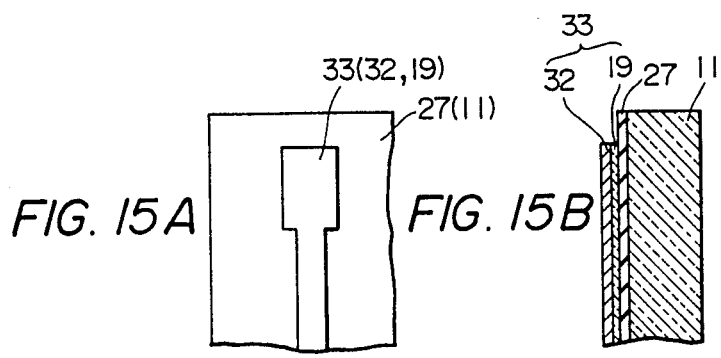
FIG. 15A  FIG. 15B
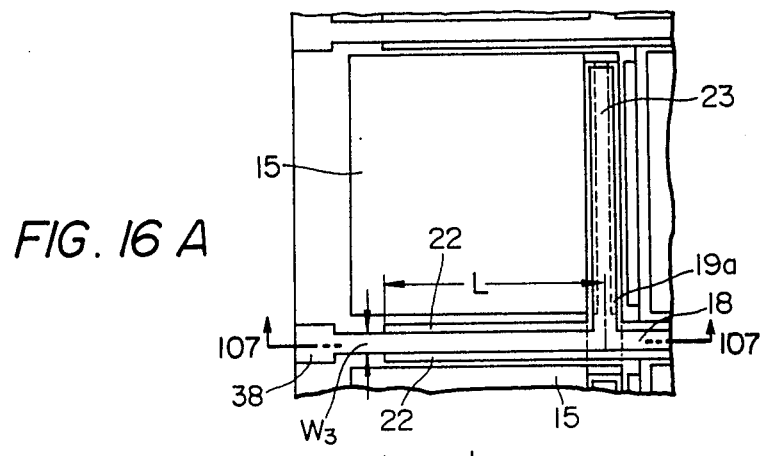
FIG. 16A
FIG. 16B
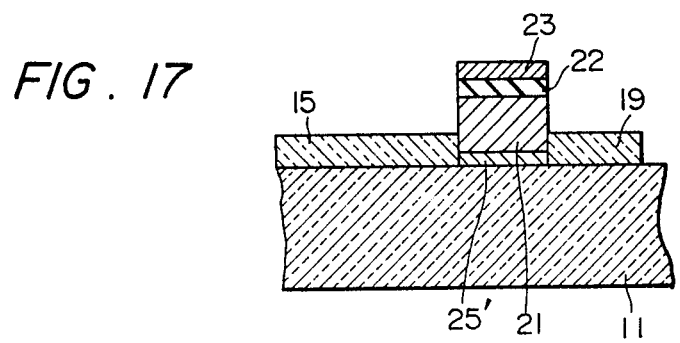
FIG. 17

LIQUID CRYSTAL DISPLAY DEVICE

BACKGROUND OF THE INVENTION

This invention relates to a liquid crystal display devices for displaying an image, for instance, and more particularly, to an active matrix type liquid crystal display device that has a plurality of display electrodes provided in a liquid crystal cell and selectively driven by thin film transistors for display.

A prior art liquid crystal display device of the conventional type has a structure as shown in FIG. 1. The device comprises a pair of transparent substrates 11, 12 of glass or the like facing each other. A spacer 13 is provided between the substrates 11 and 12 along the edges thereof. A liquid crystal 14 is sealed between the substrates 11 and 12. The substrates 11 and 12, spacer 13 and liquid crystal 14 constitute a liquid crystal cell. A plurality of display electrodes 15 consisting of a transparent conductive film are formed on the inner surface of one of the transparent substrates, i.e., substrate 11. Also thin film transistors 16 are formed as switching elements such that they are contiguous to the display electrodes 15 with their drains connected thereto. A common electrode 17 is formed on the other transparent substrate 12. The common electrode 17 faces the plurality of display electrodes 15.

The display electrodes 15 serve as picture element electrodes, for instance. As shown in FIG. 2, they are square in shape and arranged in a closely spaced-apart relation to one another. They are arranged in rows and columns on the transparent substrate 11. Gate buses 18 are formed such that they extend near and along the individual rows of display electrodes 15. Source buses 19 are formed such that they extend near and along the inidivual columns of display electrodes 15. The thin film transistors 16 noted above are formed at the intersections of the gate buses 18 and source buses 19. Each thin film transistor 16 has its gate connected to the associated gate bus 18, its source connected to the associated source bus 19 and its drain connected to the corresponding display electrode 15.

When one of the gate buses 18 and one of the source buses 19 are selected, a voltage is applied between the selected buses. As a result, only the corresponding thin film transistor 16 is turned on. Charge is stored on the display electrode 15 connected to the drain of the "on" thin film transistor 16. A voltage is applied across only a portion of the liquid crystal 14 between this display electrode 15 and the common electrode 17. Only this display electrode 15 is thus rendered transparent or opaque. In this way, only selected display electrodes are driven for display. Actually, selected display electrodes are usually rendered transparent or opaque in combination with a polarizer (not shown).

Usually, the thin film transistor 16 has a structure as shown in FIGS. 3 and 4. Referring to these Figures, the display electrodes 15 and source buses 19 are formed from a transparent conductive film, e.g., an ITO, on the transparent substrate 11. A semiconductor layer 21 or amorphous silicon or the like is formed such that it strides parallel and closely spaced-apart portions of each display electrode 15 and the associated source bus 19. A gate insulating film 22 of silicon nitride or the like is formed on the semiconductor layer 21. A gate electrode 23 is formed on the gate insulating film 22 such that it overlies part of each display electrode 15 and associated source bus 19 via the gate insulating film 22 and each semiconductor layer 21. One end of the gate electrode 23 is connected to the associated gate bus 18. Portions of the display electrode 15 and source bus 19 facing each gate electrode 23 constitute drain and source electrodes 15a and 19a, respectively. The thin film transistor 16 is constituted by these electrodes 15a and 19a, the semiconductor layer 21, the gate insulating film 22 and the gate electrode 23. The individual gate electrode 23 and gate buses 18 are formed simultaneously from aluminum, for instance.

In the above prior art structure, the semiconductor layer 21 is formed only over the region where the thin film transistor 16 is formed. Therefore, there is a considerable lever difference between the gate electrode 23 and gate bus 18 with respect to the substrate 11. Due to this level difference, breakage of the connection between the gate electrode 23 and gate bus 18 is liable to result.

Accordingly, it has been proposed to form the semiconductor layer 21 and the gate insulating film 22 such that each of them has the same pattern as that of the gate electrode 23 and gate bus 18, as shown in FIG. 5. More specifically, in this proposal each of the semiconductor layer 21 and gate insulating film 22 is formed over the entire surface other than the regions of display electrode 15 and source bus 19 in the same pattern as that of the contiguous gate bus 18 and gate electrode 23 to be formed. Then an aluminum layer, for instance, for the gate bus 18 and gate electrode 23, is formed over the two layers. With this structure, the level difference between the gate bus 18 and gate electrode 23 with respect to the substrate 11 is reduced to reduce the possibility of breakage of connection. In this case, however, the surface distance (i.e. distance along the surface) between the gate electrode 23 and the source electrode 19a and that between the source electrode 19a and source bus 18 are reduced, leading to the problems of current leaks between these parts.

Further, with the structure noted above a parasitic thin film transistor is formed by a portion 21a (not shown in FIG. 5; see FIGS. 8 and 16B) of the semiconductor layer 21 that does not constitute the thin film transistor 16, gate insulating film 22, source bus 19 and drain electrode 15a. The amorphous silicon of the semiconductor layer 21 is photo-conductive, and its resistivity is reduced from $10^9 \Omega$-CM to about $10^4 \Omega$-cm when it is illuminated by light of 100,000 luxes. Therefore, when the semiconductor layer portion 21a of the parasitic thin film transistor is illuminated, a current leak from the source base 19 adjacent to the thin film transistor 16 is caused to deteriorate the on-off ratio thereof.

In order to prevent deterioration of the on-off ratio of the thin film transistor 16 with the illumination of the semiconductor layer 21 thereof, a light-blocking layer 25 of chromium or like metal is formed such that it faces the semiconductor layer 21, as shown in FIG. 5. In this case, the light-blocking layer 25 is insulated from display electrode 15 and source bus 19 by an insulating layer 27. It may be thought to form the light-blocking layer 25 such that it faces the entire surface of the semiconductor layer portion 21a to avoid the influence of the parasitic thin film transistor noted above. In this case, however, the electrostatic capacitance between the light-blocking layer and gate bus is increased too much to permit high speed control of the thin film transistor.

To reduce the electrostatic capacitance between the light-blocking layer 25 and drain and source electrodes 15a and 19a and that between the afore-mentioned extension of the light-blocking layer 25 and gate bus, it may be thought to increase the thickness of the insulating layer 27. Doing so, however, requires increased time for manufacture and deteriorates the yield.

In a further aspect, the source bus terminal is constituted by the same material as the source bus, while the gate bus terminal is constituted by the same material as the gate bus. For example, the source bus terminal is made of a transparent conductive material, e.g., ITO, while the gate bus terminal is made of aluminum. Since the two terminals are made of different materials, their connection to an external drive circuit requires different connection steps suited to these materials. The connection process, therefore, is rather cumbersome.

Further, the ITO constituting the source bus 19 has a comparatively low electric conductivity, that is, the source bus 19 has a comparatively high electric resistance. Therefore, a comparatively large difference in the drive voltage is produced between the opposite ends of the source bus 19. In other words, the transistors provided along the source bus can not be driven with a uniform voltage. This leads to a brightness slope in the screen of the liquid crystal display device according to the potential gradient along the source bus. It may be thought to increase the thickness of the source bus 19 to solve this problem. Doing so, however, would result in the precipitation of In during the formation of ITO by the plasma chemical vapor deposition process. The ITO film is thus denatured to deteriorate the characteristics of the thin film transistor. Further, since the source bus 19 is transparent, light leaks from portions of the source bus 19 which are not overlaid by the transistors 16 and gate buses 18. This deteriorates the contrast of the displayed image.

SUMMARY OF THE INVENTION

An object of the invention is to provide a liquid crystal display device which can be comparatively readily manufactured, can reduce the possibility of contamination of semiconductor layers in its manufacturing process, and has comparatively long surface distances of the source and drain electrodes from the gate electrode so that sufficient insulation can be maintained between these parts.

Another object of the invention is to provide a liquid crystal display device which can be readily connected to an external drive circuit.

A further object of the invention is to provide a liquid crystal display device with which a display image having high contrast can be obtained.

A further object of the invention is to provide a liquid crystal display device in which gate buses and gate electrodes have less level difference with respect to the associated substate so that they are less liable to be broken and the on-off ratio of thin film transistors is high, and which is capable of high speed operation.

A still further object of the invention is to provide a liquid crystal display device in which the influence of parasitic transistors is reduced.

According to one feature of the invention, in a liquid crystal display device in which a plurality of display electrodes are selectively driven through control of thin film transistors, the semiconductor layer and the gate insulating layer of the thin film transistor have the same pattern, each gate electrode is formed such that its edges are inwardly spaced apart from the corresponding edges of the gate insulating film, and the surface distances of the source and drain electrodes from the gate electrode are increased to maintain sufficient insulation between these electrodes.

According to another feature of the invention, the semiconductor layer and gate insulating film have extensions extending under the gate bus, and the gate bus and gate electrode have less level difference with respect to the associated transparent substrate so that they are less liable to be broken. In addition, a light-blocking layer is formed such that it faces the semiconductor layer of the thin film transistor. The light-blocking layer has an extension having an extra width on each side and extending to occupy the junction of the gate bus and corresponding gate electrode. The influence of the parasitic transistor is blocked by the extra width portion.

According to a further feature of the invention, the semiconductor layer and gate insulating layer have extensions extending under the gate bus, and the ratio $L/W_3$ of the distance L between the gate bus and the nearest thin film transistor conencted to the gate bus to the width $W_3$ of the gate bus is set such that the current that flows from the nearest thin film transistor to the corresponding display electrode is higher by the order of one digit place or above than the current flowing from a parasitic transistor to the nearest thin film transistor on the side of the gate bus terminal to the display electrode. the ratio $L/W_3$ is selected to be preferably higher than 4.5, for example.

According to another feature of the invention, each of the source bus terminals is formed as a double-layered structure of a layer of the same material as that of the source buses and a layer of the same metal as the gate buses, the latter layer being formed on the former layer so that the portions of both the source bus terminals and the gate bus terminals can be directly connected to an external drive circuit.

According to a further feature of the invention, auxiliary conductive layers of the same material as the gate buses are formed on the source buses such that they are spaced apart from the gate buses and gate electrodes. The auxiliary conductive layers have an effect of reducing the resistance of the source buses, so that a display having a uniform brightness can be obtained over the entire screen. In addition, the auxiliary conductive layers block light, so that substantially no light is transmitted at any time. Thus, it is possible to obtain an image display having a satisfactory contrast.

According to a still further feature of the invention, amorphous silicon is used for the semiconductor layer of the thin film transistor, and a light-blocking layer of an amorphous silicon compound semiconductor having a smaller energy band gap than the energy band gap of amorphous silicon is formed such that it is contiguous to the semiconductor layer.

Further, a plurality of the features noted above are combined.

BRIEF DESCRIPTION OF THE DRAWINGS

FIGS. 15A and 15B are a fragmentary plan view and a fragmentary sectional view, respectively, showing a source bus terminal;

FIGS. 16A and 16B are a fragmentary plan view and a fragmentary sectional view, respectively, showing a gate bus terminal; and FIG. 17 is a fragmentary sectional view showing a thin film transistor with a nonmetallic light-blocking layer 25' continuous to a semiconductor layer 21.

DETAILED DESCRIPTION OF THE PREFERRED EMBODIMENTS

Figure 6:
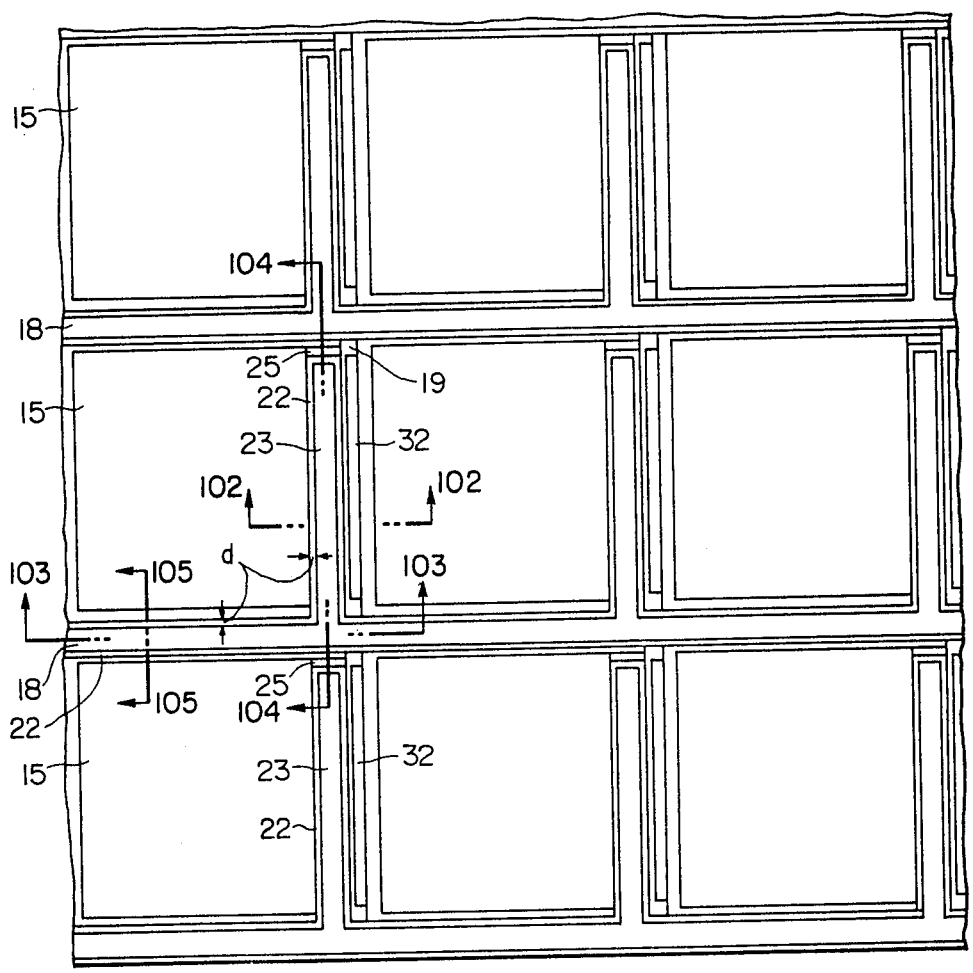
FIG. 6 is a fragmentary plan view similar to FIG. 3 but showing a main portion of a liquid crystal display device according to the invention.

FIG. 6 shows an embodiment of the liquid crystal display device according to the invention. This embodiment of device, like the device described before in connection with FIG. 2, has display electrodes 15 arranged as picture element electrodes in rows and columns. Parts like those in FIGS. 1 to 4 are designated by like reference numerals.

Figure 1:
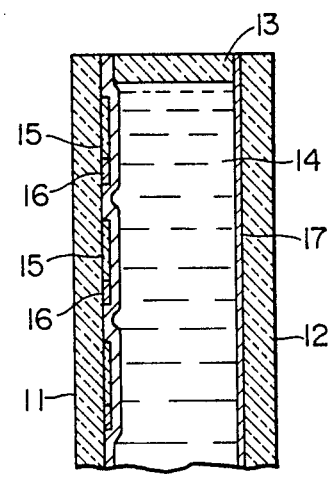
FIG. 1 is a fragmentary sectional view showing a prior art liquid crystal display device.
Figure 2:
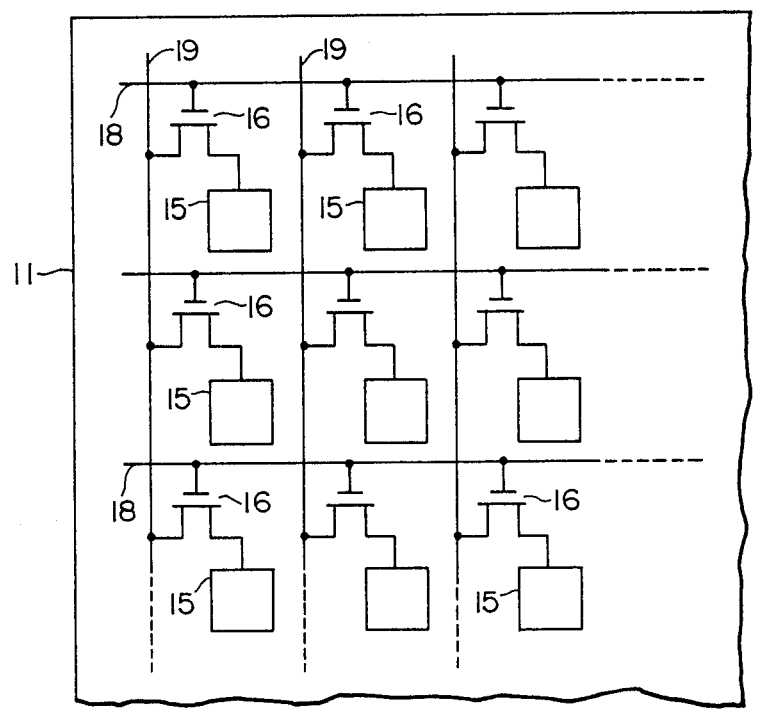
FIG. 2 is a circuit diagram showing an electric circuit of display electrodes and thin film transistors of the liquid crystal display device shown in FIG. 1.
Figure 3:
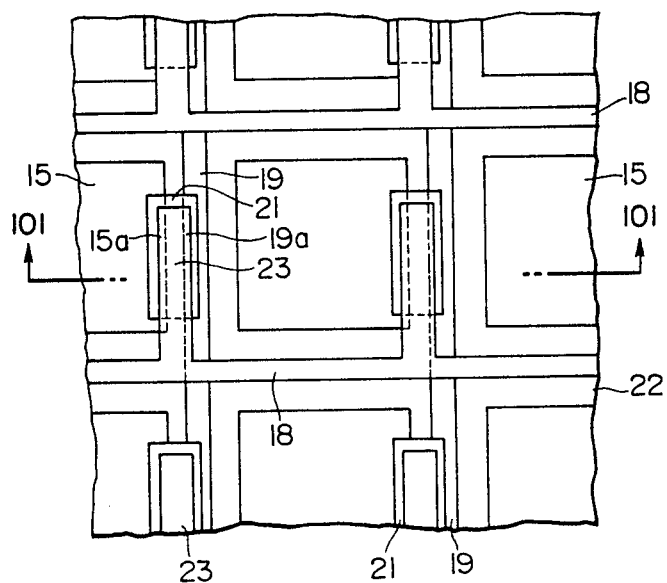
FIG. 3 is a fragmentary plan view showing display electrodes 15 and thin film transistors 16 in the prior art structure shown in FIG. 2.
Figure 4:
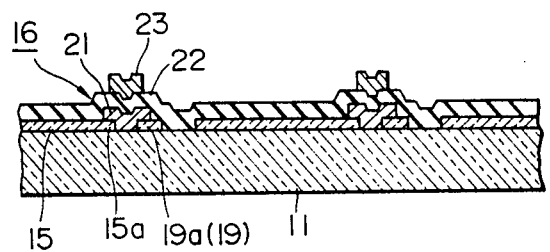
FIG. 4 is a sectional view taken along line 101—101 in FIG. 3.
Figure 5:
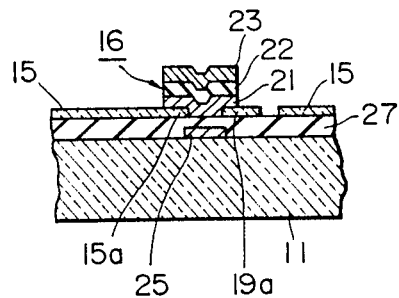
FIG. 5 is a sectional view showing a prior art thin film transistor with a light-blocking layer.
Figure 7:
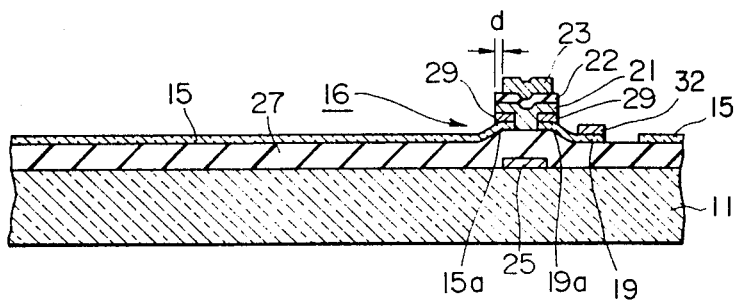
FIG. 7 is a sectional view taken along line 102—102 in FIG. 6.
Figure 8:
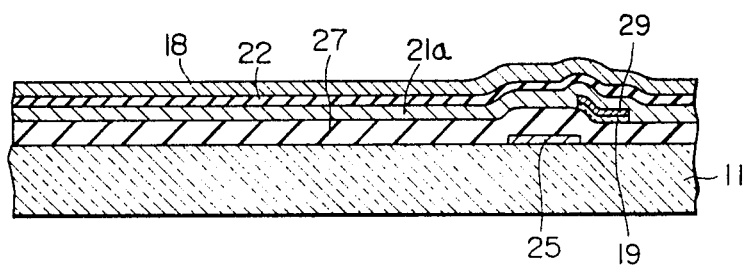
FIG. 8 is a sectional view taken along line 103—103 in FIG. 6.
Figure 9:
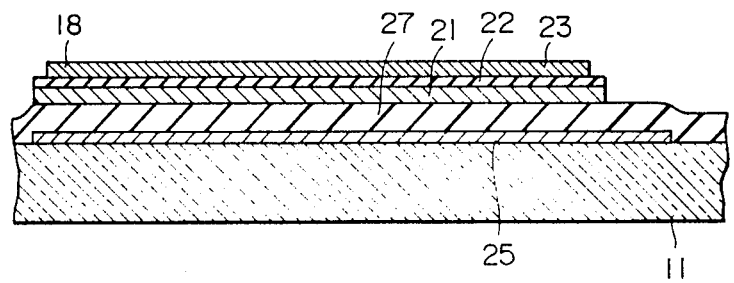
FIG. 9 is a sectional view taken along line 104—104 in FIG. 6.
Figure 10:
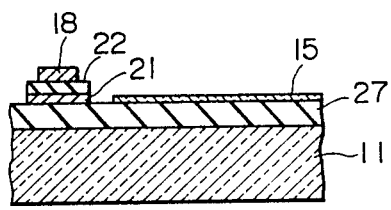
FIG. 10 is a sectional view taken along line 105—105 in FIG. 6.

FIG. 6 is a plan view similar to FIG. 3. FIG. 7 is a sectional view similar to FIG. 4, showing a thin film transistor 16. FIG. 8 is a sectional view taken along and showing a gate bus 18. FIG. 9 is a sectional view taken along and showing a channel region of the thin film transistor 16. FIG. 10 is a sectional view taken along and showing a gate bus. The structure shown in FIGS. 6 through 10 will now be described with reference to FIGS. 11 through 14 in the order of the steps of manufacture.

Figure 11:
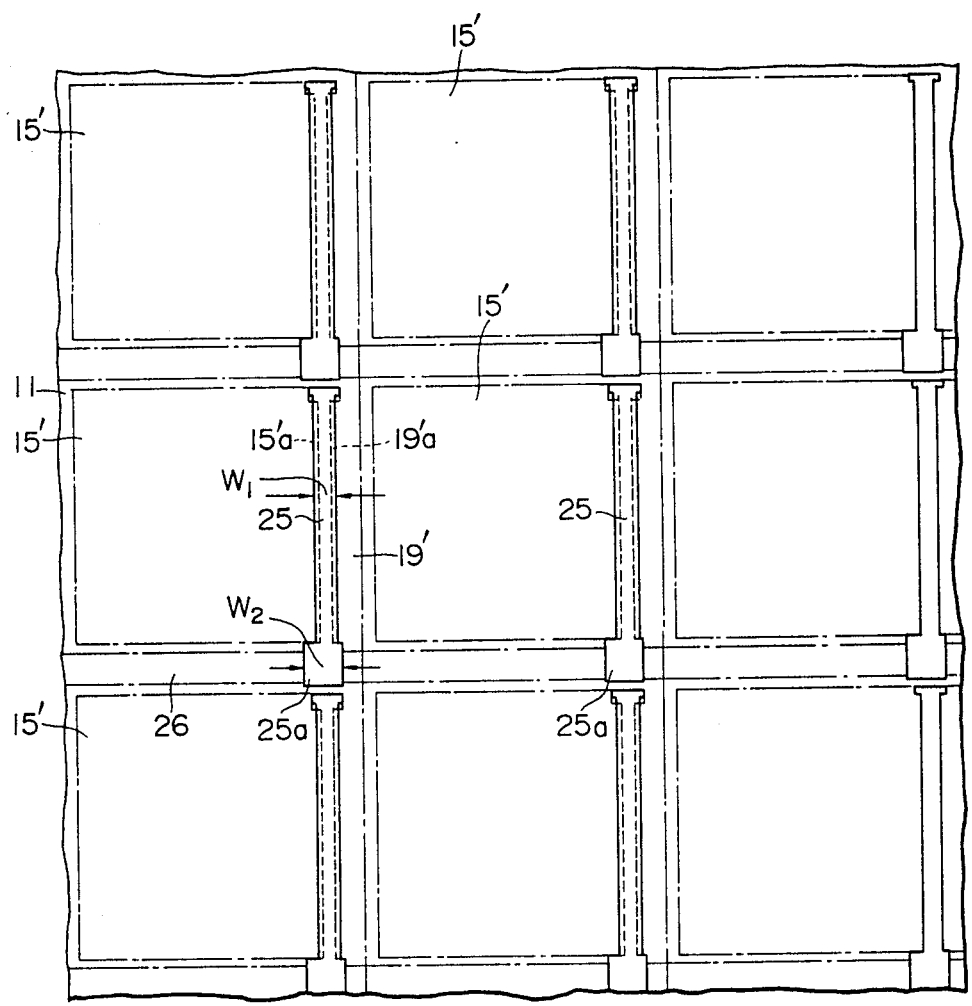
FIG. 11 is a fragmentary plan view showing an arrangement with metallic light-blocking layer 25 formed on a transparent substrate.
Figure 12:
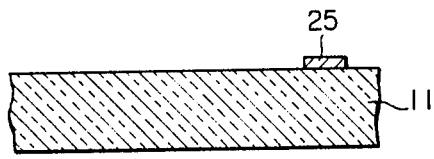
FIGS. 12A to 12I are sectional views illustrating a process of manufacture of the display electrodes and thin film transistors shown in FIG. 6.
Figure 12:
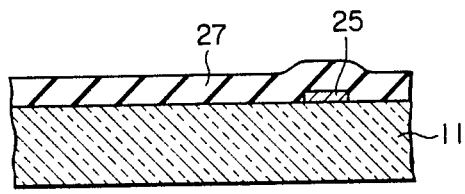
Figure 12:
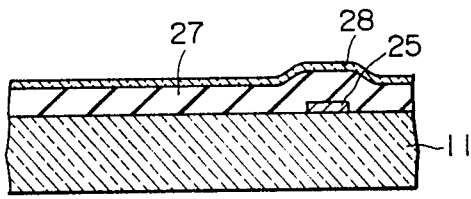
Figure 12:
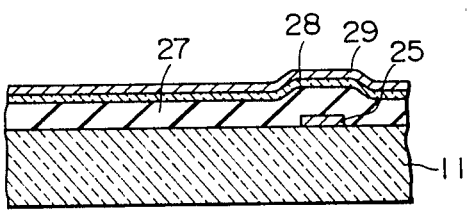
Figure 12:
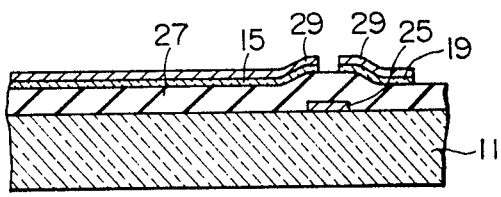
Figure 12:
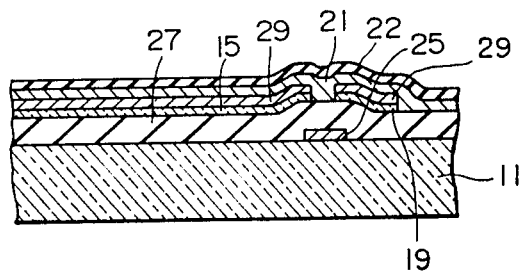
Figure 12:
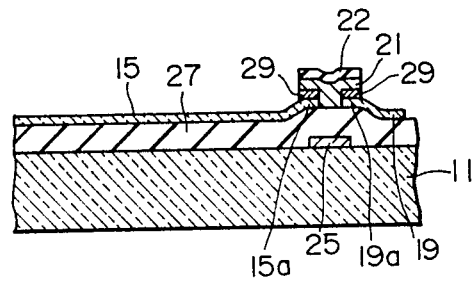
Figure 12:
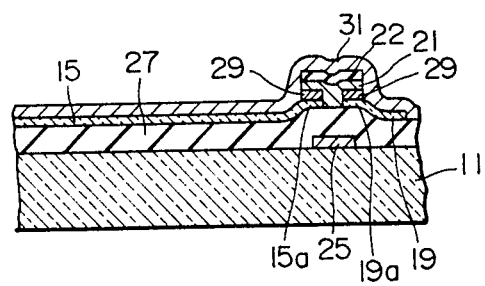
Figure 12:
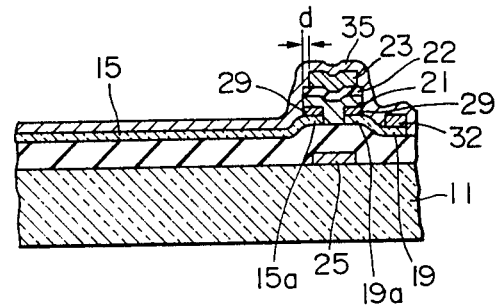
Figure 13:
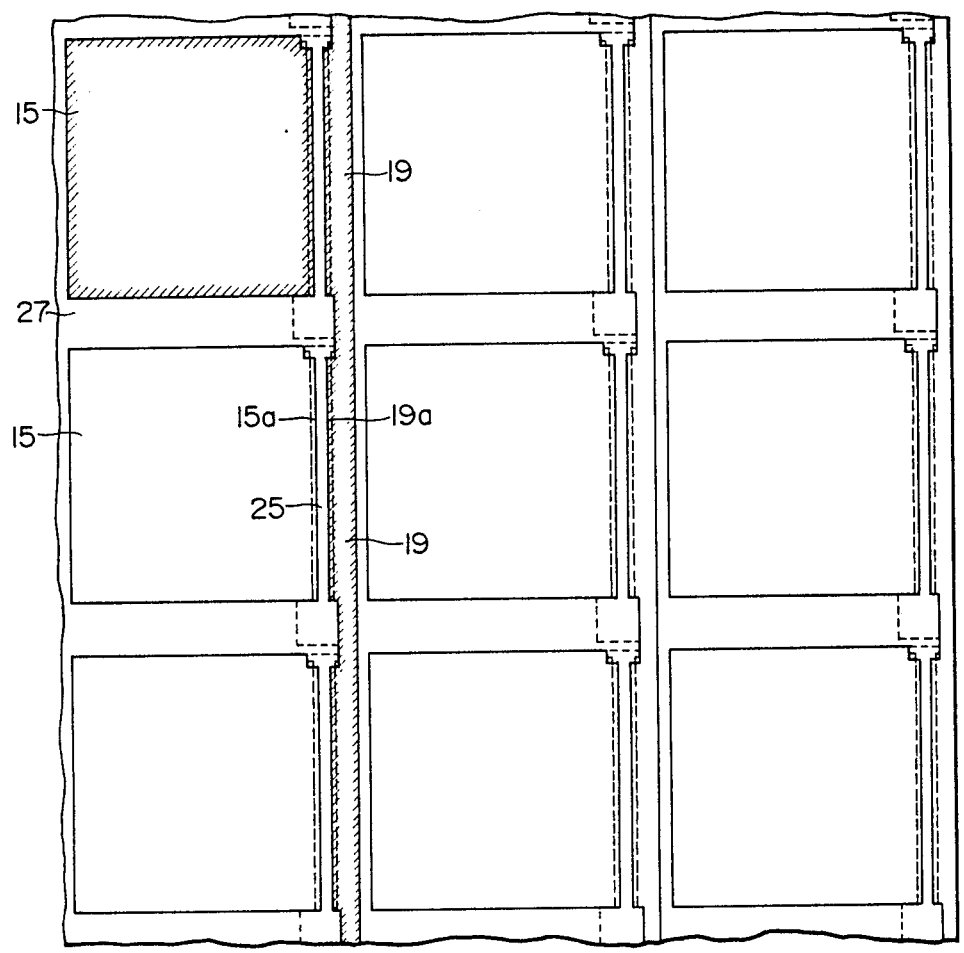
FIG. 13 is a fragmentary sectional view showing display electrodes and source buses.

In this embodiment, light-blocking layers are formed. More specifically, as shown in FIGS. 11 and 12A, each light-blocking layer 25 is formed on a portion of transparent substrate 11 between a region 15', which is to be occupied by a display electrode 15, and a region 19', which is to be occupied by a source bus 19. The light-blocking layer 25 overlies portions of regions 15a' and 19a' which are to serve as source and drain electrodes 15a and 19a, respectively. The light-blocking layer 25 is made of chromium, for instance, and completely faces a so-called channel region of thin film transistor 16. In this embodiment, it extends into a region 26, which is to be occupied by a gate bus, to form a blocking portion 25a. The blocking portion 25a overlying the region 26 has extra width on each side with respect to the rest of it corresponding to the channel region.

Subsequently, an insulating layer 27 of silicon dioxide, for instance, is formed over the entire surface of the transparent substrate 11, as shown in FIGS. 7 to 10 and 12B. A transparent conductive film 28, of ITO for instance, is then formed on and over the entire surface of the insulating film 27 (FIG. 12C). The film 28 will constitute the display electrodes 15 and source buses 19. An ohmic contact layer 29, of n+-type amorphous silicon for instance, is then formed on and over the entire surface of the transparent conductive film 28, as shown in FIG. 12D, so that ohmic contact with the semiconductor layer can be reliably obtained. The transparent conductive film 28 and ohmic contact layer 29 are then selectively photo-etched to form display electrodes 15, drain electrodes 15a, source buses 19 and source electrodes 19a, as shown in FIGS. 7 to 10 and 13. At this time, the ohmic contact layer 29 remains on each display electrode 15 and source bus 19, as shown in FIG. 12E.

Figure 14:
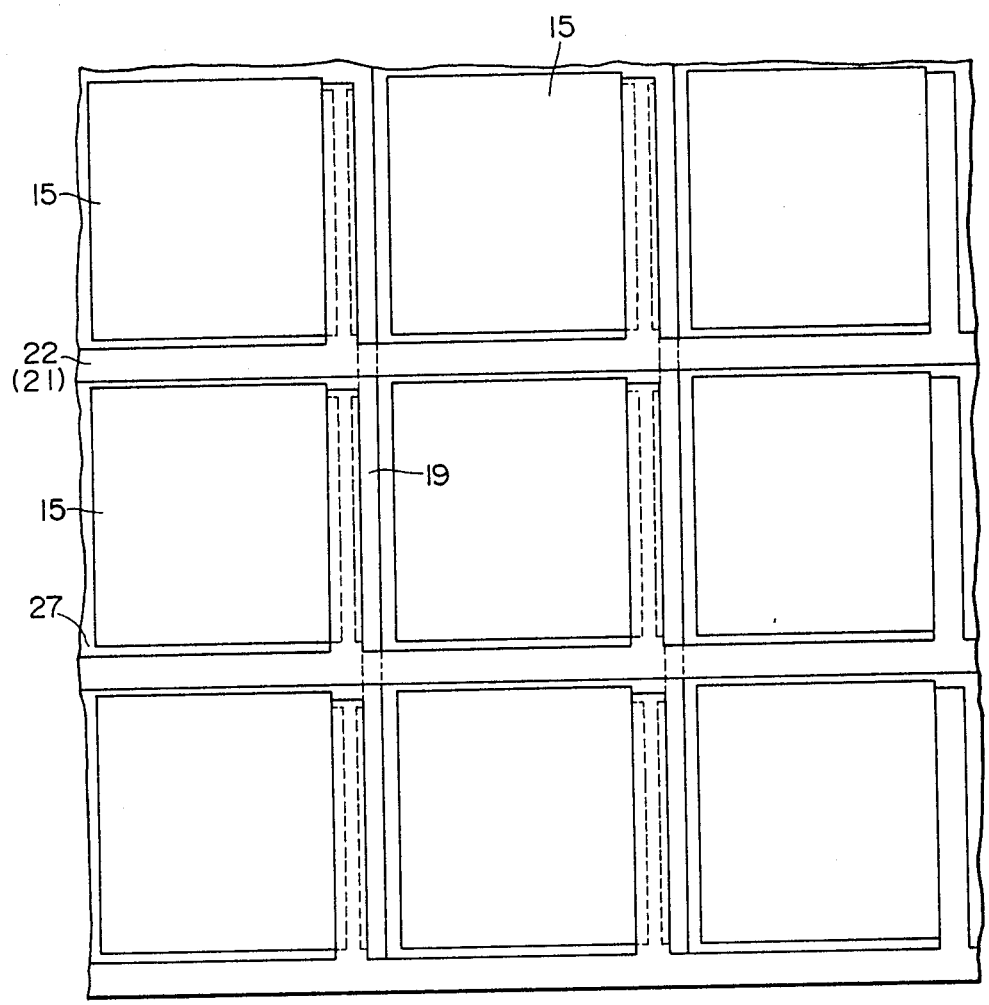
FIG. 14 is a fragmentary plan view showing semiconductor layers.

A semiconductor layer 21 of amorphous silicon or the like is then formed on and over the entire surface of the wafer, as shown in FIG. 12F. A gate insulating film 22, e.g., a silicon nitride film, is formed on the semiconductor film 21. The semiconductor layer 21 and gate insulating film 22 are then selectively photo-etched to leave those regions constituting the thin film transistors 16, i.e. the regions striding across the opposing marginal edges of the display electrodes 15 and the source buses 19, and also those regions corresponding to the gate buses 18 but being slightly wider than them. The portions of the photo-etched semiconductor layer 21 left above the blocking portions 25a of the light-blocking layer 25 have a width $W_2$ which is slightly larger than the width $W_1$ of the portions 25a of photo-etched semiconductor layer 21 left as parts of the thin film transistors as shown in FIG. 14. At the time of the selective photo-etching patterning of the gate insulating film 22 and the semiconductor layer 21, the ohmic contact layer 29 over the display electrodes 15 and source buses 19 is removed except for portions over the drain and source electrodes 15a and 19a as shown in FIG. 12G. Further, the semiconductor layer 21 and gate insulating film 22 are patterned with entirely the same pattern so that they perfectly overlie each other. The semiconductor layer 21 is in ohmic contact with the drain and source electrodes 15a and 19a via the ohmic contact layer 29.

Subsequently, a metal layer, e.g., an aluminum layer 31, which will constitute the gate electrodes, is formed as shown in FIG. 12H. This layer is then selectively photo-etched to form the gate electrodes 23 and gate buses 18, as shown in FIGS. 6 to 10. This patterning is done such that the edges of the gate electrode 23 and gate bus 18 are not flush with the corresponding edges of the patterned gate insulating film 22 but are inwardly spaced apart therefrom by a slight distance d, e.g., 2 to 3 microns or above as shown in FIGS. 6, 7, 10 and 12I. Further, auxiliary conductive layers 32 are preferably formed from an aluminum layer 31 on the source buses 19 each to extend along one side of the adjacent display electrode 15 between the adjacent two gate buses 18, as shown in FIGS. 6 and 7. That is, the source bus 19 preferably has a double-layer structure. It is also preferable to form source bus terminals 33 in a similar double-layer structure as shown in FIGS. 15A and 15B, where each source bus terminal 33 consists of a layer 19 of the same material (e.g. ITO) as the source bus 19 and an auxiliary conductive layer 32.

Further, at a terminal 38 of each gate bus 18, as shown in FIGS. 16A and 16B, denoting the width of the gate bus 18 by $W_3$ and the distance between the end of the gate insulating film 22 and source electrode 19a under the gate bus 18 by L, $L/W_3$ is set to 4.5 or above. With the structure of this embodiment, the end of the semiconductor layer portion 21a extending underneath the gate bus 18 is connected to the gate bus terminal 38, and a sort of parasitic FET is formed by the gate bus terminal 38 as the source along with the drain electrode 15a, semiconductor layer 12a and gate bus 18. The afore-mentioned ratio $L/W_3$ is set such that the current that flows from the channel of the thin film transistor 16 to the display electrode 15 is higher by the order of one digit place or above than the current flowing from the parasitic FET to the display electrode 15.

After the thin film transistor 16 have been formed, a passivation film 35 consisting of a transparent insulating film, e.g., of silicon nitride, polyimide, etc., is formed over the entire surface, as shown in FIG. 12I. The passivation film 35 prevents direct contact of the thin film transistors 16 with the liquid crystal 14. Thus, it improves the stability. In addition, it reduces leakage current between the gate 23 and source and drain electrodes 19a and 15a.

As has been shown, with the liquid crystal display device according to the invention the semiconductor layer 21 and gate insulating film 22 are formed under the entirety of the gate electrode 23 of each thin film transistor 16 and each gate bus 18. Thus, the difference in level between the gate electrode 23 and the gate bus 18 with respect to the substrate 11 is reduced sufficiently to reduce the possibility of breakage of the connection between the gate electrode 23 and the gate bus 18. In addition, the possibility of short-circuit between the gate and the source buses 18 and 19 is reduced by the presence of the two layers, i.e., the semiconductor layer 21 and the gate insulating film 22, between these buses 18 and 19.

Further, according to the invention the side edges of the gate electrode 23 and gate bus 18 are spaced apart inwardly, by the distance d in FIG. 7, from the corresponding side edges of the gate insulating film 22. Thus, the surface distance of the drain or source electrode 15a or 19a from the gate electrode 23 is increased to reduce the possibility of current leakage between these electrodes. Further, the gate insulating film 22 and semiconductor layer 21 have the same pattern and perfectly overlie each other. Since these two layers are patterned simultaneously, the possibility of contamination between these two layers is reduced.

Further, where the auxiliary conductive layer 32 is formed on the source bus 19 as described above, the thickness of the source bus is increased to reduce the possibility of breakage of the bus. In addition, the electric resistance is reduced. Besides, the auxiliary conductive layer 32 is formed simultaneously with the formation of the gate electrode 23 and does not require any additional step of manufacture. Moreover, the double-layer structure of the source bus terminal 33 consisting of the material of the source bus 19 and the auxiliary conductive layer 32 as described before in connection with FIGS. 15A and 15B, has a further advantage. The surface of the source bus terminal 33, which is to be connected to the external part, is constituted by the same material as the gate bus terminal 38. Thus, the source and gate bus terminals can be connected simultaneously and under the same conditions to an external drive circuit by means of thermal press or soldering, which is very convenient.

Further, according to the invention the light-blocking layer 25 with the extra width portion 25a is provided. The semiconductor layer portion 21a extending underneath the gate bus 18 undergoes a resistance reduction when it receives external light, i.e., ambient external light or illumination light. Unless the extra width portion 25a is provided, a current increase would result from the resistance reduction at the time when the thin film transistor 16 is turned off. The extra width portion 25a substantially eliminates such current increase. In other words, the extra width portion 25a eliminates the interaction between the semiconductor layer portion 21a underneath the gate bus 18 and the channel portion of the thin film transistor 16. If the light-blocking layer 25 is formed underneath the entire length of each gate bus 18, the increase of the current when the thin film transistors 16 are turned off can be significantly reduced. In this case, however, a large electrostatic capacitance is formed between the light-blocking layer 25 and gate bus 18, and coupled to the gate electrode 23, which is undesired.

The source buses 19 are constituted by a transparent conductive film, which has a comparatively high resistance. If it is intended to reduce the resistance of each source bus 19 by increasing the thickness thereof, the manufacturing process is extended. In addition, deterioration of the thin film transistor characteristics due to denaturing is liable to result. Since the source buses 19 are transparent, the liquid crystal display device can transmit light in the regions of the source buses 19 at all times. The contrast of the displayed image is thus correspondingly deteriorated. The auxiliary conductive layer 32, however, blocks light and can accordingly improve the contrast. In addition, it reduces the reistance of each soruce bus 19. This has an effect of improving the uniformity of brightness of the image display on the display device.

The passivation film 35 eliminates mutual adverse effects of the liquid crystal 14 and thin film transistors 16. In addition, it reduces the possibility of a fault such as a short-circuit between buses due to rubbing. Further, it can block any residual DC component of a liquid crystal drive signal waveform, i.e., it will prevent such DC component from being applied across the liquid crystal 14.

In the above embodiment, the light-blocking layer 25 has been made of a metal. However, it is possible to provide light-blocking layers made of materials other than metals, e.g., black in, a light-blocking insulating film or a compound semiconductor composed of amorphous silicon and a light-absorbing metal.

FIG. 17 shows an instance, which uses a non-metal light-blocking layer. In this instance, the non-metal light-blocking layer 25' is formed on transparent substrate 11, and a semiconductor layer 21 of amorphous silicon is formed on the layer 25'. In this example, light-blocking layer 25', semiconductor layer 21, gate insulating film 22 and gate electrode 23 (gate bus 18) are formed by simultaneous selective photo-etching patterning using the same mask. Subsequently, display electrode 15 and source bus 19 are formed directly on and contiguous with the substrate 11. As an alternative to this example, an insulating layer capable of blocking sodium ions may be formed on transparent substrate 11, and display electrode 15, source bus 19 and light-blocking layer 25' may be formed on the insulating layer.

The light-blocking layer 25' of this example is made of a compound semiconductor containing amorphous silicon. This compound semiconductor has a narrower energy band gap and no less resistivity than those of the amorphous silicon constituting the semiconductor layer 21. For example, such compound semiconductors as amorphous silicon germanium and amorphous silicon tin may be used. The energy band gap of these compound semiconductors is 1.0 to 1.7 electron volts, which is narrower than that of the amorphous silicon semiconductor layer 21, namely 1.7 to 20 electron volts.

The light-blocking layer 25' may be formed using a so-called plasma chemical vapor deposition process. A binary compound semiconductor layer of amorphous silicon germanium may be obtained by using SiH and GeH gases as sources of components and by suitably controlling their mole ratio. The layer thus formed contains silicon and germanium in atomic weight proportions of about 0.8:0.2. These proportions may be suitably varied by appropriately selecting the mole ratio of the vapor growth. Usually, germanium is contained more than the ratio of 0.8:0.2 noted above. A binary compound semiconductor of amorphous silicon tin may be obtained by suitably selecting the mole ratio of $SiH_4$ and $Sn(CH_3)_4$, i.e., by controlling the gas flow. In either case, it is possible to obtain a resistivity of $10^8$ to $10^{12}$ $\Omega$-cm, which is substantially the same as the resistivity of the amorphous silicon semiconductor layer 21. It is possible to form first a layer of amorphous silicon germanium or amorphous silicon tin as the light-blocking layer and continually form an amorphous silicon-layer, i.e., the semiconductor layer 21.

The amorphous silicon compound semiconductor light-blocking layer is free from the problems of the electrostatic capacitance and insulation between it and the display electrode and source bus. In addition, it can be readily formed.

The light-blocking layer 25', however, may be omitted. Further, the display electrodes 15 are not limited to the picture element electrodes and may be used in other forms as well. For example, seven display electrodes may be arranged as respective segments of a figure eight and selectively driven for the display of a figure.

We claim:

1. A liquid crystal display device comprising:
   a liquid crystal cell including first and second transparent substrates spaced apart a small distance and facing each other and a liquid crystal sealed between said first and second transparent substrates;
   a common electrode constituted by a transparent conductive film formed on the inner surface of said first transparent substrate;
   a plurality of display electrodes constituted by a transparent conductive film formed on the inner surface of said second transparent substrate; and
   a plurality of thin film transistors each having a drain connected to one of said display electrodes;
   each of said thin film transistors including:
   a drain electrode constituted by a portion of said display electrode;
   a source electrode provided in the vicinity of said drain electrode;
   a semiconductor layer provided between and in contact with said drain and source electrodes;
   a gate insulating film having the same pattern as and perfectly overlying said semiconductor layer; and
   a gate electrode formed on said gate insulating film, an edge of said gate electrode being spaced apart inwardly from the corresponding edge of said gate insulating film;
   said source electrodes and gate electrodes of said plurality of thin film transistors being connected to source buses and gate buses, respectively, said source buses having terminals each constituted by a lamination of a first layer of the same material as said source buses and a second layer of the same material as said gate buses.

2. A liquid crystal display device comprising:
   a liquid crystal cell including first and second transparent substrates spaced apart a small distance and facing each other and a liquid crystal sealed between said first and second transparent substrates;
   a common electrode constituted by a transparent conductive film formed on the inner surface of said first transparent substrate;
   a plurality of display electrodes constituted by a transparent conductive film formed on the inner surface of said second transparent substrate;
   a plurality of thin film transistors each having a drain connected to one of said display electrodes, each of said thin film transistors including:
   a drain electrode constituted by a portion of said display electrode;
   a source electrode provided in the vicinity of said drain electrode;
   a semiconductor layer provided between and in contact with said drain and source electrodes;
   a gate insulating film formed on said semiconductor layer; and
   a gate electrode formed on said gate insulating film;
   said device further comprising:
   a plurality of gate buses, to which the gate electrodes of said thin film transistors are connected;
   a plurality of source buses, to which the source electrodes of said thin film transistors are connected; and
   auxiliary conductive layers formed on said source buses from the same material as said gate buses and spaced apart from said gate electrodes and said gate buses.

3. A liquid crystal display device comprising:
   a liquid crystal cell including first and second transparent substrates spaced apart a small distance and facing each other and a liquid crystal sealed between said first and second transparent substrates;
   a common electrode constituted by a transparent conductive film formed on the inner surface of said first transparent substrate;
   a plurality of display electrodes constituted by a transparent conductive film formed on the inner surface of said second transparent substrate;
   a plurality of thin film transistors each having a drain connected to one of said display electrodes, eac of said thin film transistors including:
   a drain electrode constituted by a portion of said display electrode;
   a source electrode provided in the vicinity of said drain electrode;
   a semiconductor layer provided between and in contact with said drain and source electrodes;
   a gate insulating film formed on said semiconductor layer; and
   a gate electrode formed on said gate insulating film;
   said device further comprising:

a plurality of gate buses, to which the gate electrodes of said thin film transistors are connected;

a plurality of source buses, to which the soruce electrodes of said thin film transistors are connected;

extensions of said semiconductor layer and gate insulating film provided underneath said gate buses;

light-blocking layers each formed on said second transparent substrate and facing each of said thin film transistors above thereof; and extra width portions each formed as an extension of each of said light-blocking layers and substantially occupying an area of intersection between said gate bus and said source bus.

4. A liquid crystal display device comprising:

a liquid crystal cell including first and second transparent substrates spaced apart a small distance and facing each other and a liquid crystal sealed between said first and second transparent substrates;

a common electrode constituted by a transparent conductive film formed on the inner surface of said first transparent substrate;

a plurality of display electrodes constituted by a transparent conductive film formed on the inner surface of said second transparent substrate;

a plurality of thin film transistors each having a drain connected to one of said display electrodes, each of said thin film transistors including:

a drain electrode constituted by a portion of said display electrode;

a source electrode provided in the vicinity of said drain electrode;

a semiconductor layer provided between and in contact with said drain and source electrodes;

a gate insulating film formed on said semiconductor layer; and a gate electrode formed on said gate insulating film; said device further comprising:

a plurality of gate buses, to which the gate electrodes of said thin film transistors are connected;

a plurality of source buses, to which the source electrodes of said thin film transistors are connected; and extensions of said semiconductor layer and gate insulating film provided underneath said gate buses;

wherein the ratio $L/W_3$ of the distance L from one end of each said extension on the side of each gate bus terminal of said gate bus to the nearest thin film transistor connected to said gate bus to the width $W_3$ of said gate bus is selected such that the current that flows from said nearest thin film transistor to the corresponding display electrode is higher by the order of one digit place or above than the current flowing from a parasitic transistor to said nearest thin film transistor on the side of said gate bus terminal to said display electrode.

5. The liquid crystal display device according to claim 4, wherein said ratio $L/W_3$ is 4.5 or above.

6. A liquid crystal display device comprising:

a liquid crystal cell including first and second transparent substrates spaced apart a small distance and facing each other and a liquid crystal sealed between said first and second transparent substrates;

a common electrode constituted by a transparent conductive film formed on the inner surface of said first transparent substrate;

a plurality of display electrodes constituted by a transparent conductive film formed on the inner surface of said second transparent substrate;

a plurality of thin film transistors each having a drain connected to one of said display electrodes, each of said thin film transistors including:

a drain electrode constituted by a portion of said display electrode;

a source electrode provided in the vicinity of said drain electrode;

a semiconductor layer of amorphous silicon provided between and continuous to said drain and source electrodes;

a gate insulating film formed on said semiconductor layer, and a gate electrode formed on said gate insulating film; and light-blocking layers formed on said second transparent substrate below and in direct contact with said semiconductor layer of each said thin film transistor, said light-blocking layers being constituted by an amorphous silicon compound semiconductor having a narrower energy band gap and no less resistivity than that of amorphous silicon.

7. The liquid crystal display device according to claim 6, wherein the source and gate electrodes of each of thin film transistors are connected to said source and gate buses, respectively.

8. The liquid crystal display device according to claim 1, wherein said semiconductor layer and gate insulting film have extensions provided underneath said gate buses.

9. The liquid crystal display device according to claim 2, wherein said semiconductor layer and gate insulating film have extensions provided underneath said gate buses.

10. The liquid crystal display device according to claim 4, 8 or 9, which further comprises light-blocking layers each formed on said second transparent substrate and below each of said thin film transistors, each said light-blocking layer having an extra width portion formed as an extension thereof to occupy an area of intersection between said gate bus and source bus.

11. The liquid crystal display device according to claim 10, wherein each said light-blocking layer with said extra width portion is constituted by a metal layer and an insulating layer is formed between said light-blocking layer and the corresponding semiconductor layer.

12. The liquid crystal display device according to claim 10, wherein said light-blocking layers with said extra width portions have substantially the same resistivity as the resistivity of said semiconductor layers and are each continuous to the corresponding semiconductor layer.

13. The liquid crystal display device according to claim 12, wherein said semiconductor layers are made of amorphous silicon and said light-blocking layers with said extra width portions are made of a compound semiconductor such as amorphous silicon germanium and amorphous silicon tin with an energy band gap less than the energy band gap of amorphous silicon.

14. The liquid crystal display device according to one of claims 3, 4, 7 and 8, wherein auxiliary conductive layers are formed on each said source bus such that they are spaced apart from said gate bus and each said gate electrode and each of said source buses has a terminal constituted by a lamination of a layer of the same material as said source bus and a metal layer of the same material as said gate bus.

15. The liquid crystal display device according to claim 7, wherein extensions of said semiconductor layer and gate insulating film are provided underneath said gate buses.

16. The liquid crystal display device according to claim 8, 9 or 15, wherein the ratio $L/W_3$ of the distance L from one end of each said extension on the side of each gate terminal of said gate bus to the nearest thin film transistor connected to said gate bus to the width $W_3$ of said gate bus is selected such that the current that flows from said nearest thin film transistor to the corresponding display electrode is higher by the order of one digit place or above than the current flowing from a parasitic transistor to said nearest thin film transistor on the side of said gate bus terminal to said display electrode.

17. The liquid crystal display device according to claim 1, wherein said source and drain electrodes are contiguous to a light-blocking layer on the side of said semiconductor layer, and said light-blocking layer, semiconductor layer, gate insulating film and gate electrode all have the same pattern.

* * * * *